United States Patent
Bouisse

(10) Patent No.: US 9,041,470 B2
(45) Date of Patent: May 26, 2015

(54) WIRELESS COMMUNICATION UNIT AND SEMICONDUCTOR DEVICE HAVING A POWER AMPLIFIER THEREFOR

(75) Inventor: Gerard Bouisse, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 701 days.

(21) Appl. No.: 12/936,215

(22) PCT Filed: Apr. 22, 2008

(86) PCT No.: PCT/IB2008/053139
§ 371 (c)(1),
(2), (4) Date: Oct. 4, 2010

(87) PCT Pub. No.: WO2009/130544
PCT Pub. Date: Oct. 29, 2009

(65) Prior Publication Data
US 2011/0031571 A1 Feb. 10, 2011

(51) Int. Cl.
*H04B 1/10* (2006.01)
*H01L 23/66* (2006.01)
*H01L 23/64* (2006.01)
*H03F 3/24* (2006.01)
*H03F 3/60* (2006.01)
*H01L 23/00* (2006.01)

(52) U.S. Cl.
CPC ............ *H01L 23/66* (2013.01); *H01L 23/642* (2013.01); *H01L 2223/6644* (2013.01); *H01L 2224/49175* (2013.01); *H01L 2224/49433* (2013.01); *H01L 2924/14* (2013.01); *H01L 2924/19041* (2013.01); *H01L 2924/30107* (2013.01); *H01L 2924/3011* (2013.01); *H03F 3/245* (2013.01); *H03F 3/601* (2013.01); *H01L 24/49* (2013.01); *H01L 2924/01021* (2013.01); *H01L 2924/01322* (2013.01)

(58) Field of Classification Search
USPC ................. 330/303, 304, 305, 306, 307, 192; 257/528, 531, 532, 533
See application file for complete search history.

(56) References Cited

U.S. PATENT DOCUMENTS

| 7,057,464 B2 * | 6/2006 | Bharj ............................ 330/302 |
| 7,119,613 B2 | 10/2006 | Bakker |
| 2004/0061214 A1 | 4/2004 | Crescenzi, Jr. |
| 2005/0083118 A1 | 4/2005 | Bakker |

FOREIGN PATENT DOCUMENTS

WO  2006/097893 A  9/2006

OTHER PUBLICATIONS

International Search Report and Written Opinion correlating to PCT/IB2008/053139 dated Jul. 17, 2009.

* cited by examiner

*Primary Examiner* — Michael Shingleton

(57) ABSTRACT

A semiconductor package device comprises a radio frequency power transistor having an output port operably coupled to a single de-coupling capacitance located within the semiconductor package device. The single de-coupling capacitance is arranged to provide both high frequency decoupling and low frequency decoupling of signals output from the radio frequency power transistor.

14 Claims, 4 Drawing Sheets

FIG. 1 – Prior Art

WIRELESS COMMUNICATION UNIT AND SEMICONDUCTOR DEVICE HAVING A POWER AMPLIFIER THEREFOR

FIELD OF THE INVENTION

The field of this invention relates to radio frequency (RF) power amplifiers (PAs) and semiconductor device packages therefor. The invention is applicable to, but not limited to, a packaged device comprising a single ended RF PA offering an improved video bandwidth.

BACKGROUND OF THE INVENTION

In the field of this invention, manufacturers of power amplifiers (PAs), and wireless communication units arranged to use PAs, are constantly aiming to design more efficient topologies capable of providing better performance. In wireless communication standards, the bit rates supported by the wireless communication units continue to increase, thereby creating larger modulation (baseband) signals that can be supported, for example in terms of frequency. As a consequence, larger instantaneous bandwidths (often called Video Bandwidth, (VBW)) are required to be supported in the RF PA of the wireless communication units supporting these wireless communication standards.

The VBW or instantaneous bandwidth performance of an RF PA, relates to a maximum bandwidth of the modulating signal (e.g. corresponding to the bit rate) that the amplifier is capable of amplifying. Next generation wireless standards (such as the long-term evolution (LTE) version of the $3^{rd}$ generation wireless communication standard termed the 3G Partnership Project (3GPP), WiMAx, 4G standards, etc.) require significantly higher VBW or instantaneous bandwidth performance, of the order of 50-100 MHz when compared to current standards (Global System for Mobile communications (GSM) the General Packet Radio System (GPRS), sometimes referred to as 2.5 G, etc.), which require of the order of 20 MHz. Therefore, the requirement for instantaneous bandwidth is increasing proportionally.

Typically, power amplifier integrated circuits (PAICs) are manufactured by semiconductor device manufacturers, and then purchased by, for example, wireless communication unit manufacturers. The wireless communication unit manufacturers often re-design the input and output matching networks of their transmitter to accommodate the PAICs in their particular transmitter architectures. Consequently, the wireless communication unit manufacturers are able to affect the performance of the RF PA on the PAIC by incorporating particular high value capacitor(s) close to the active device in order to be able to guarantee a given level of performance.

Referring now to FIG. 1, an example of a known RF PA circuit 100 is schematically illustrated. The RF PA circuit 100 comprises an external input circuit 105 that receives a 50 ohm RF input signal 120 and provides an RF input signal to packaged device 110. The packaged device 110 comprises an input matching circuit 125 operably coupling the RF input signal to a single-ended RF PA transistor 130. In this context, the term 'single-ended' refers to a common mode amplifier and not a differential mode such as a push-pull amplifier. An output of the drain port of the RF PA transistor 130 is operably coupled to an output matching circuit. The output matching circuit comprises a resonant inductor (Lshunt) 135 in series with a decoupling capacitance 140. The series resonant inductor (Lshunt) 135 and decoupling capacitance 140 are located in parallel across the drain-source ports of the RF PA transistor 130. The decoupling capacitance 140 is selected such that it provides high frequency decoupling of the RF PA transistor output; that is the decoupling capacitance 140 provides a low impedance, for example substantially in a form of a short circuit at radio frequencies, such that the parallel reactance (at RF frequencies) on the drain functions as an inductance. The decoupling capacitance 140 also provides DC blocking of the Vds source, as Vds is applied on the transistor drain.

The packaged device 110 provides an amplified RF output to an external output circuit 115. The external output circuit 115 comprises series inductance 155, an isolation inductor 160 and low frequency capacitive de-coupling 165 (external to the device package). The external output circuit 115 provides a matched RF amplified signal 170. The resonant inductor 135 resonates the transistor's output capacitance 140. As mentioned above, high frequency de-coupling is performed inside the RF transistor device package 110 via capacitor 140.

Capacitor 140 is typically a Si capacitance, for example a metal oxide semiconductor (MOS) or metal/dielectric/semiconductor. This capacitor has a capacitance value that is limited primarily due to the fact that the RF transistor is a large power device, which requires low impedance on the RF transistor's drain, as indicated above. The capacitance value is also limited due to the capacitance density available in existing semiconductor technologies, the need to embed the capacitance as semiconductor devices within the device package and the specific form factor of the transistor used in the device package. In addition, the value of the resonant (shunt) inductor 135, which is created due to the use of wire-bonding in coupling different semiconductor devices (such as RF transistor 130 and capacitor 140), is of the order of 200 pH. Thus, in order for the resonant inductor to cause capacitor 140 to resonate, capacitor 140 located inside the RF transistor device package 110, is typically selected to be of the order of 200 pF, for a 50/80 W transistor, which is suitable for cellular base stations.

In particular, as an alternative to the low frequency capacitive de-coupling 165 (external to the device package), it is also known that such wireless communication unit manufacturers are may introduce one or more high value capacitor(s) 150 close to the active device, where the high value capacitor(s) provides additional low frequency de-coupling to the PAIC. As a consequence, RF PA device manufacturers are required to provide for an integrated circuit (IC) pin 145 on the RF PA device package, located close to the capacitor 140, to enable the wireless communication unit manufacturer to couple the high value capacitor(s) to the PAIC (110), as shown, in order to provide the required additional low frequency de-coupling.

Notably, low frequency decoupling is performed on the printed circuit board, located external to the transistor's PAIC package device 115, such that, in combination, capacitor 140 and external capacitor 150, or external high capacitance value capacitors 165, provide the DC blocking and low frequency decoupling of the RF output.

A significant problem with the typical RF PAIC illustrated in FIG. 1 is the limitation imposed on the VBW performance by the external inductive/capacitive network. The RF PAIC VBW is limited by the resonant frequency of the LC circuit, mostly determined by the 200 pF capacitor 140 and the large isolation inductor 160 and shunt inductor 135. This is illustrated in the low frequency equivalent network circuit on the output side of the amplifier, as shown generally at 175. As also illustrated, the VBW performance is proportional to the inverse square root of the total inductance multiplied by the total capacitance at the RF PA output. At low frequency, the output is high impedance, thereby allowing a voltage to take place and affect the amplifier linearity.

A significantly lower capacitance value is unsuitable, due to the subsequent increase in inductance series loss and the capacitance series loss of using a lower capacitance value, thereby resulting in lower operating efficiency of the RF PAIC. Up until very recently, inherent limitations in capacitor manufacturer technologies prevented a manufacture of capacitor 140 from reaching much higher values, in an acceptable form, due to physical limitations in capacitance density.

It is known that a pure capacitor provides a short circuit as high in frequency as 1/Cw is small at the frequency of operation (w) with respect to a given impedance. Thus, for a pure capacitance, the larger the value the better the short and therefore a pure 1 pF provides a better short circuit at 2 GHz than 200 pF. As mentioned previously, capacitors are in real life resonators, i.e. equivalent to a series RLC. The effect of the series equivalent inductance is to lower the reactive value of that resonator at a given frequency. Below a resonance frequency, given in equation [1], the component acts as a capacitor. Above the resonance frequency, the component acts as an inductance. This is why conventional large value capacitors provide good low frequency short circuits and poor RF short circuits (they act as an inductance, i.e. a high impedance instead of a low impedance). Similarly, small value capacitors with very low parasitic values provide good RF short circuits and poor low frequency short circuits, because of their capacitance value.

For example, existing μF capacitors were known to provide very poor RF short circuits. The equivalent circuit of these capacitors is an R-L-C series network, with a large inductance value. Thus, at RF frequencies of the order of 2 GHz mobile communications, the μF capacitor performed as an equivalent inductance.

US71196113B2 discloses a radio frequency power amplifier device package that comprises such an additional pin on the integrated circuit. The additional pin is necessary on the device package to enable the power amplifier transistor to connect to an external capacitor. Again, the source port of the power amplifier transistor is operably coupled to a first capacitance that is internal to the device package. As explained above, the first capacitance performs two functions: a first function performing direct current (DC) blocking, as Vds is applied on the power amplifier transistor drain; and a second function performing a radio frequency (RF) short circuit at high frequencies, such that the parallel reactance (at RF frequencies) on the power amplifier transistor drain port functions as an inductance. Notably, US71196113B2 requires additional pins to the PAICs used currently in the industry, where high power transistors are provided in two wide lead packages (one lead used as an input and one lead used as an output. Thus, US71196113B2 requires a specific (non conventional) device package having at least one additional lead (ideally two pins) next to the output lead. This leads compatibility problems, mounting problems, etc.

Thus, low frequency decoupling of the power amplifier transistor drain is currently only realisable by locating one or more large value capacitor(s) external to the device package, for example on the application circuit, such as capacitor 150 of FIG. 1.

SUMMARY OF THE INVENTION

The present invention provides a wireless communication unit and a RF PA semiconductor device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF EMBODIMENTS

Embodiments of the invention will be described with respect to an implementation of a radio frequency (RF) power amplifier (PA) integrated circuit for example suitable for use in a wireless communication unit, such as a cellular base station or a wireless communication unit, for example a mobile phone. In this manner, the embodiments are described with respect to implementing an 80 W base station using laterally diffused metal oxide semiconductor (LDMOS) technology. However, it is envisaged that the term 'power transistor' used hereinafter encompasses much lower power transistors, for example those suitable for use in mobile phone technology, where the output power is of the order of, say 1 W. Furthermore, it is envisaged that embodiments of the invention are suitable in non-final PA stages, such as for use in pre-amplifier networks. In addition, it is envisaged that embodiments of the invention may be implemented in any type of RF amplifier device package. It is also envisaged that embodiments of the invention may be implemented with any type of RF transistor technology, such as LDMOS, gallium nitride (GaN), bipolar technology, etc.

Figure 2:
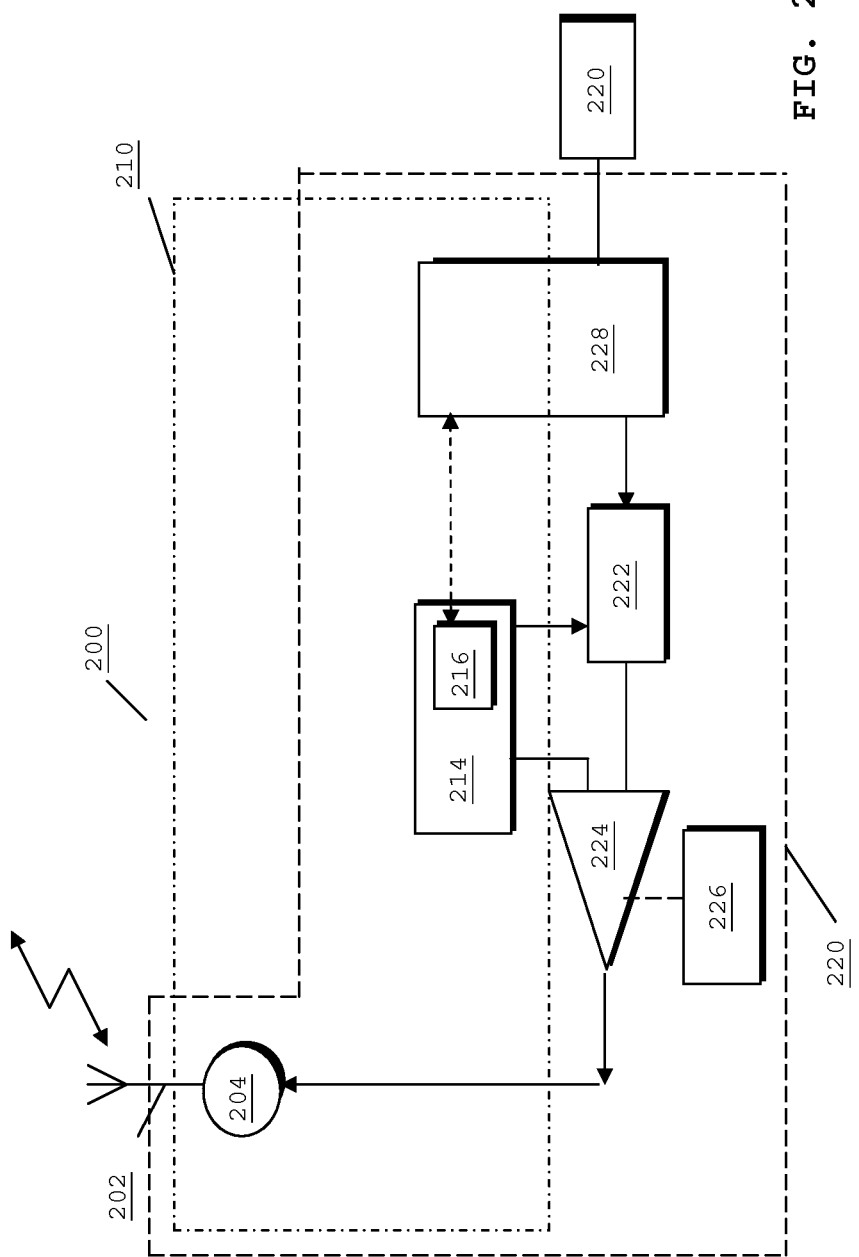
FIG. 2 schematically illustrates a block diagram of a wireless communication unit comprising a radio frequency power amplifier circuit according to embodiments of the invention.

Referring now to FIG. 2, a block diagram of a wireless communication unit 200, capable of using the RF PAIC according to embodiments of the invention, is illustrated. For the sake of clarity, the wireless communication unit 200 is shown as divided into two distinct portions—a receiver chain 210 (which will not be described for clarity purposes only) and a transmitter chain 220. The wireless communication unit 200 contains an antenna coupled to an antenna switch 204 that provides signal control of radio frequency (RF) signals in the wireless communication unit 200, as well as isolation, between the receiver chain 210 and transmit chain 220. Clearly, as understood by a skilled artisan, the antenna switch 204 may be replaced with a duplex filter, for frequency duplex communication units, as known to those skilled in the art.

With regard to the transmit chain 220, this essentially includes a signal processor 228, operably coupled to a modulation and up-converter circuit 222 and power amplifier module 224. A power source 226 is operably coupled to the PA module 224. The processor 228 and modulation and up-converter circuit 222 are operationally responsive to the controller 214. A timer 218 is operably coupled to the controller 214 to control the timing of operations, namely the transmission or reception of time-dependent signals. The power amplifier module 224 comprises a power amplifier integrated circuit (PAIC) being provided with a voltage source 226 and comprising a RF power transistor and associated RF matching components, adapted in accordance with embodiments of the invention and described in greater detail with respect to FIG. 3.

Figure 1:
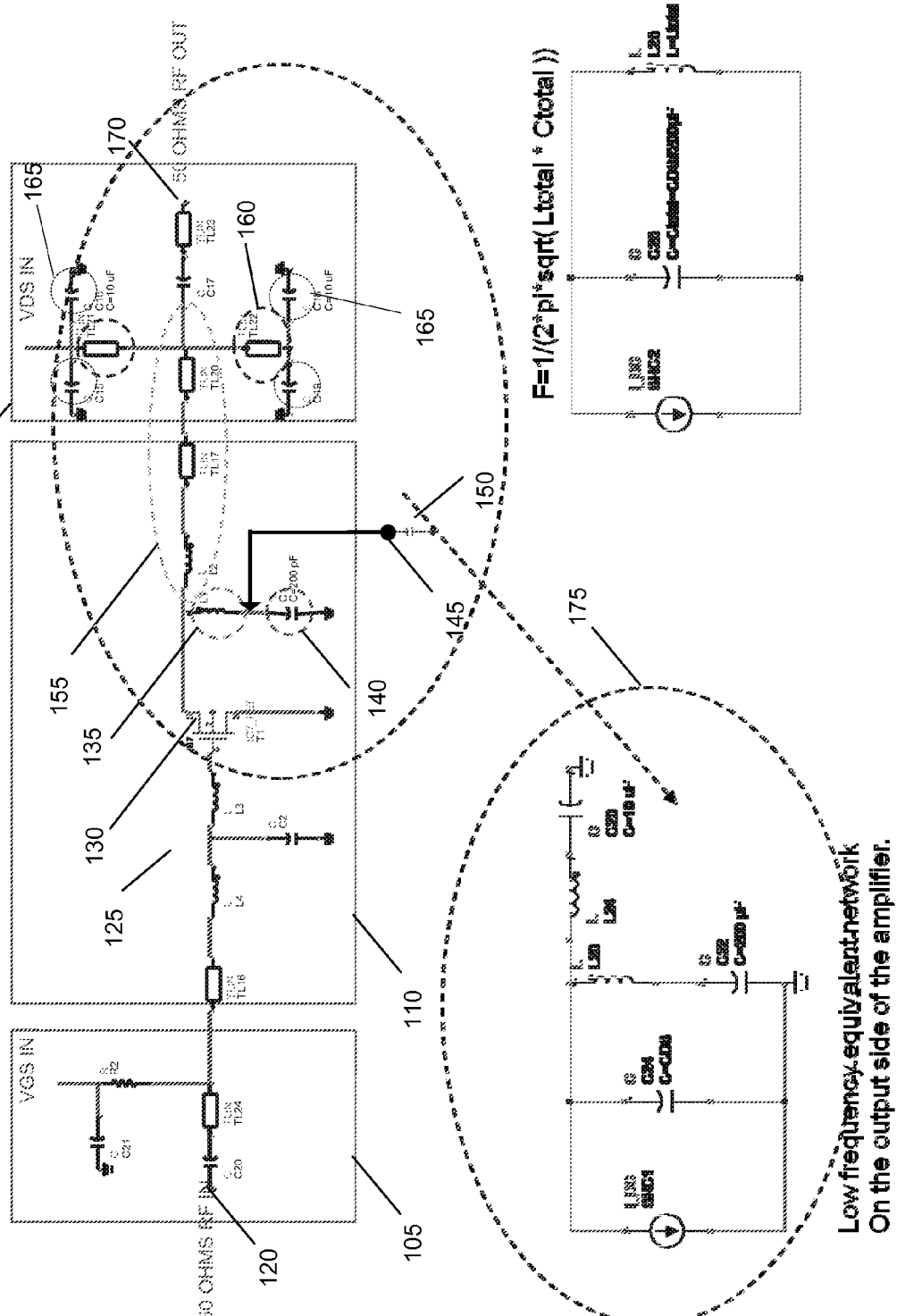
FIG. 1 schematically illustrates an example of a known radio frequency power amplifier circuit.
Figure 3:
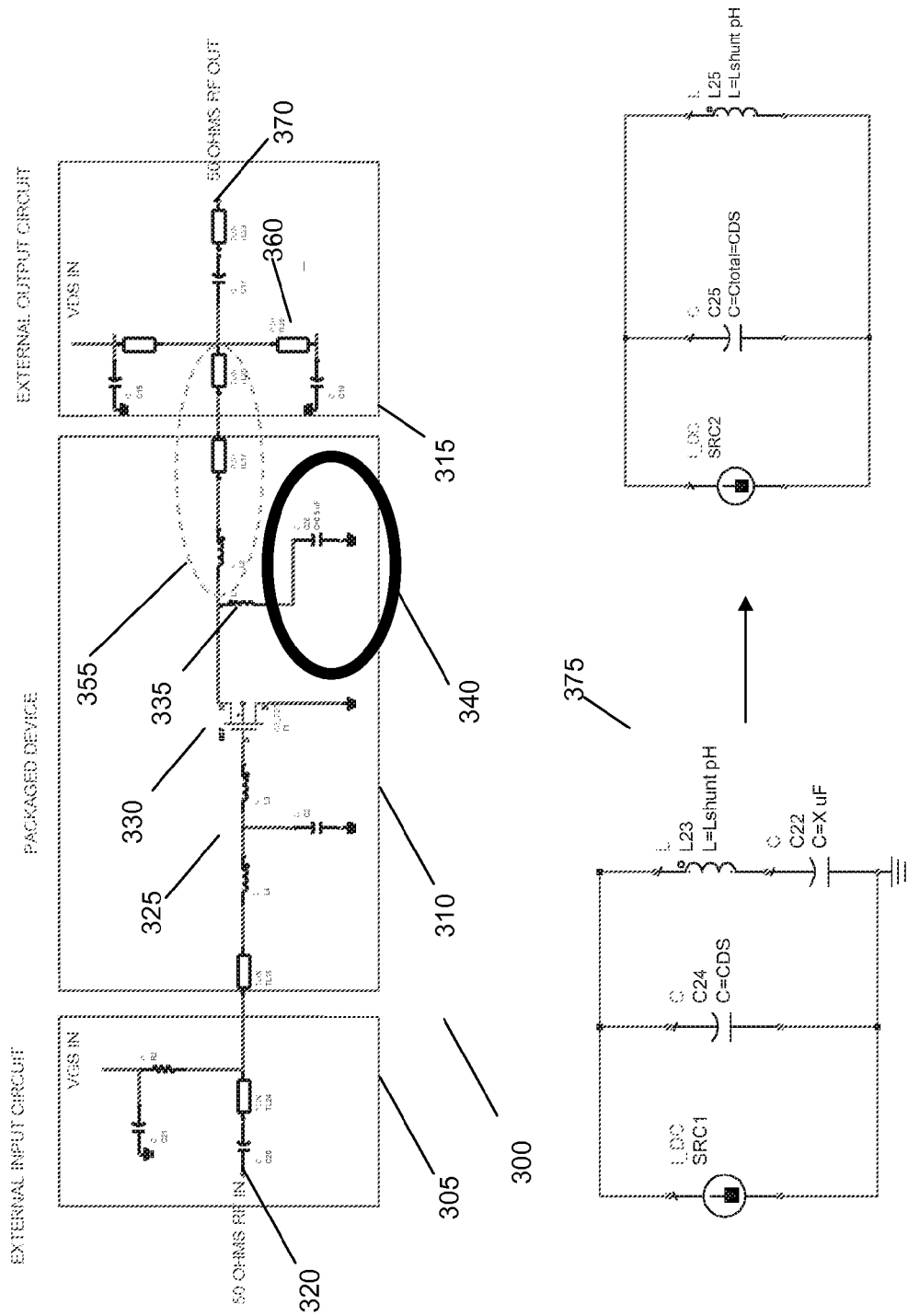
FIG. 3 schematically illustrates an example of a radio frequency power amplifier circuit according to embodiments of the invention.

Referring now to FIG. 3, and in accordance with some embodiments of the invention, a RF PAIC 300 is adapted by replacing the known internal RF high frequency decoupling capacitor (i.e. replacing capacitor 140 of a value of the order of 200 pF in the example illustrated in FIG. 1) with a high value capacitor that is able to decouple both high frequencies and low frequencies of signals output from the high power RF transistor. Thus, the replacement capacitor acts as a short circuit at (low) VBW frequencies as well as the high RF frequencies (say, 2 GHz) of the signal output from the RF transistor. The RF PA circuit 300 comprises an external input circuit 305 that receives a 50 ohm RF input signal 320 and provides an RF input signal to packaged device 310. The packaged device 310 comprises an input matching circuit 325 operably coupling the RF input signal to an RF PA transistor 330. An output of the drain port of the RF PA transistor 330 is operably coupled to an output matching circuit. The output matching circuit comprises a resonant inductor (Lshunt) 335 in series with a wideband decoupling capacitance 340. The series resonant inductor (Lshunt) 335 and wideband decoupling capacitance 340 are located in parallel across the drain-source ports of the RF PA transistor 330.

The packaged device 310 provides an amplified RF output to an external output circuit 315. The external output circuit 315 comprises an isolation inductor 360 and low frequency capacitive de-coupling 365 (external to the device package). The external output circuit 315 provides a matched RF amplified signal 370.

The resonant inductor 335 resonates the transistor's output capacitance. As mentioned above, both high frequency and low frequency de-coupling is now performed inside the RF transistor device package 310 via a single wideband decoupling capacitor 340. The capacitance value and characteristics of the new decoupling capacitor 340 are selected such that it provides low frequency and high frequency decoupling of the RF PA transistor output (namely providing a short circuit at both high frequencies and low frequencies), as well as DC blocking of the drain-source voltage (VDS). A suitable capacitor can be obtained from AVX corporation of Myrtle Beach, S.C., USA.

As illustrated in FIG. 3, the prior art need for one or more external capacitor(s), either externally coupled to the drain of the RF transistor in the packaged device or coupled to the Vds voltage line in the external output circuit, is removed.

As also illustrated in FIG. 3, the RF PAIC provides for a single wideband large capacitance to be located within the RF device package. The single wideband large capacitance uses a suitable dielectric and design process, such that this cap has a pF range value (to provide a good low frequency short) and at the same time very low parasitics (lower than the 200 pfF MOS capacitors and very low parasitic elements equivalent series resistance (ESR) and equivalent series inductance (ESL) in order to provide a good RF short). In being able to re-locate a single large capacitance much closer to the active RF transistor device than known PA circuits, the total inductive effect in the PA circuit is reduced.

This combination, as illustrated in the equivalent circuit 375, provides an improved video bandwidth performance based on the approximate VBW formula of equation [1]:

$$VBW = 1/(2*Pi*sqrt(LT*CT*w)) \quad [1]$$

Where:
  Ltotal~Lshunt; and
  Ctotal=Cds

Notably, the VBW performance of the RF transistor, when employing embodiments of the invention and as given above, is significantly greater than the prior art arrangements where Ltotal~Lseries and Ctotal=Cds (approx 20 pF) in parallel with 200 pF. In this regard, it is noteworthy that the series inductance is significantly larger than Lshunt and comprises the series wires, the output lead inductance, and the quarter wave feeders (on the printed circuit board). Thus, Ltotal and Ctotal are reduced. For a 150 W 2 GHz RF transistor, a typical VBW of an RF transistor using the embodiments of the invention will be in the range of 120-150 MHz, compared to a prior art RF transistor (according to FIG. 1) where the VBW for a similar RF transistor would be around 30 MHz.

Thus, when compared to the known prior art where the high value decoupling capacitors are external to the device itself, i.e. mounted on a printed circuit board external to the device package, and notably located at some distance from the active part of the transistor, the video bandwidth performance of the RF PAIC of FIG. 3 is significantly increased.

Figure 4:
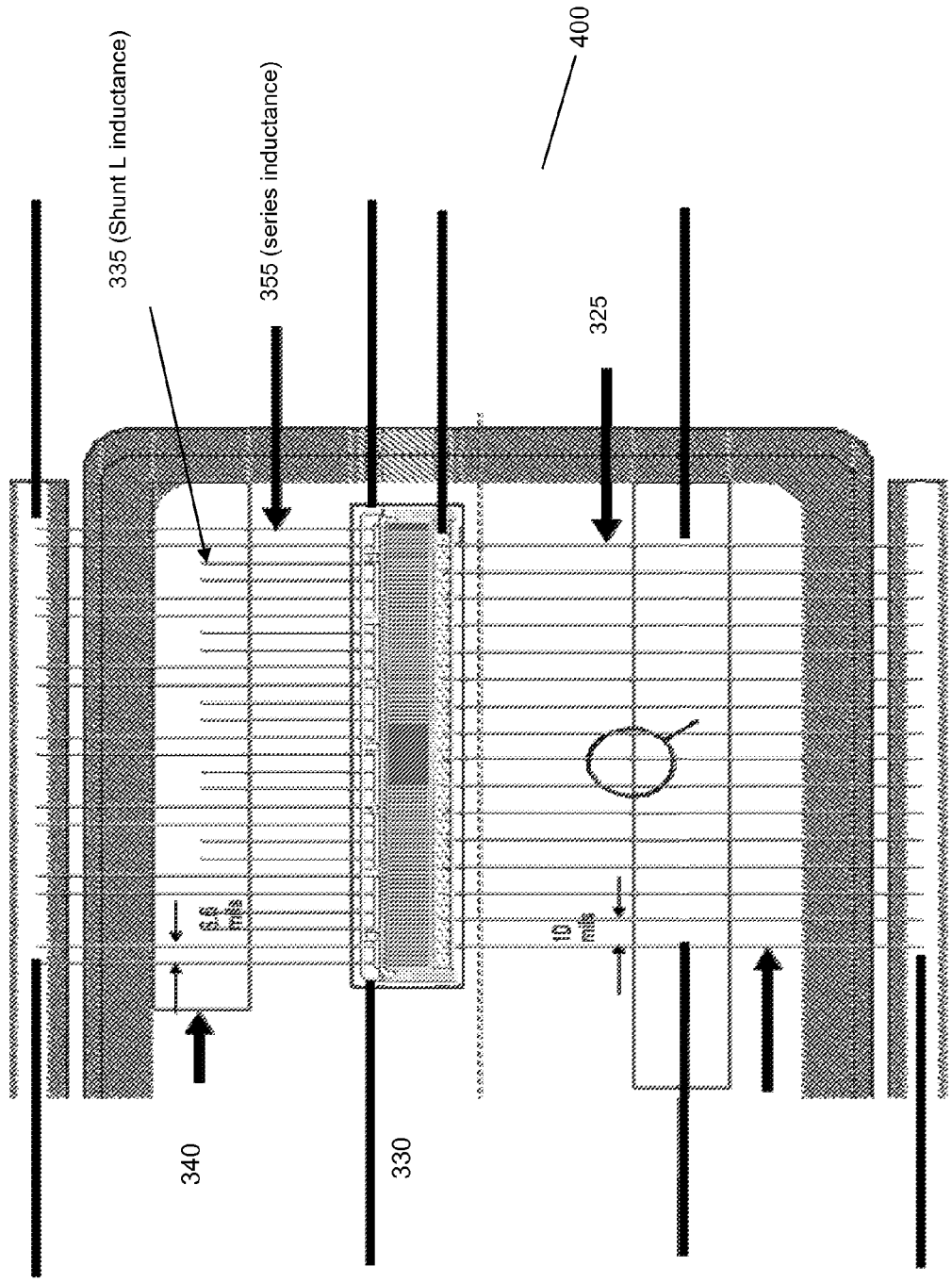
FIG. 4 schematically illustrates an example of a radio frequency power amplifier circuit layout according to embodiments of the invention.

Referring now to FIG. 4, an example of a radio frequency power amplifier integrated circuit layout 400 according to embodiments of the invention is schematically illustrated. The IC layout 400 illustrates an LDMOS transistor 330 operably coupled to single wideband capacitor 340 via inductive wire bonds 335. The single wideband capacitor 340 is able to provide both low frequency de-coupling and high frequency de-coupling based on the following characteristics: the capacitor value of µF range, the rated voltage of, in the present case, 24V, the semiconductor form factor, the grounded electrode location of the semiconductor, a solderability aspect for one electrode noting that one electrode needs to have a metallisation compatible with conventional soldering techniques, such as, for example, AuSi eutectic, and a wire-bondability aspect for the opposite side electrode, namely the electrode connected to the shunt inductance.

It is within the contemplation of the invention that the improved circuit topology may operate with substantially all types of RF power transistor types, such as laterally diffused metal oxide semiconductors (LDMOS), bipolar transistors, gallium nitride (GaN), etc. It is also within the contemplation of the invention that improved circuit topology may operate with a variety of amplifier architectures, such as Doherty-based linear PA architectures, drain modulation architectures and switched amplification techniques.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above.

As the apparatus implementing the invention is, for the most part, composed of electronic components and circuits known to those skilled in the art, circuit details will not be explained in any greater extent than that considered necessary as illustrated above, for the understanding and appreciation of the underlying concepts of the invention and in order not to obfuscate or distract from the teachings of the invention.

Although the invention has been described with respect to specific conductivity types or polarity of potentials, skilled artisans appreciated that conductivity types and polarities of potentials may be reversed.

The description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled' to each other to achieve the desired functionality.

Furthermore, those skilled in the art will recognize that boundaries between the functionality of the above described operations merely illustrative. In addition, the devices may be physically distributed over a number of apparatuses, while functionally operating as a single device. For example, devices functionally forming separate devices may be integrated in a single physical device. However, other modifications, variations and alternatives are also possible. The specifications and drawings are, accordingly, to be regarded in an illustrative, rather than in a restrictive, sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. A mere fact that certain measures recited in mutually different claims does not indicate that a combination of these measures cannot be used to advantage.

The invention claimed is:

1. A semiconductor package device comprising a radio frequency power transistor having an output port operably coupled to a one and only one de-coupling capacitance located within the semiconductor package device, wherein the one and only one de-coupling capacitance is arranged to provide both high frequency decoupling and low frequency decoupling of signals output from the radio frequency power transistor, wherein the one and only one de-coupling capacitance is in the microfarad (µF) range.

2. The semiconductor package device of claim 1 further comprising a series resonant inductor between the radio frequency power transistor and the one and only one decoupling capacitance, such that the series resonant inductor and the one and only one decoupling capacitance are located in parallel across drain-source of the RF PA transistor.

3. The semiconductor package device of claim 1, wherein the series resonant inductor and the one and only one decoupling capacitance provide a resonance frequency in a range of 120-150 MHz.

4. The semiconductor package device of claim 3, wherein the resonance frequency provides an instantaneous bandwidth performance of the radio frequency power transistor in the range of 120-150 MHz.

5. The semiconductor package device preceding claim 1, wherein the radio frequency power transistor is a single ended radio frequency power transistor.

6. A wireless communication unit comprising a semiconductor package device having a radio frequency power transistor with an output port operably coupled to a one and only one de-coupling capacitance located within the semiconductor package device, wherein the one and only one de-coupling capacitance is arranged to provide both high frequency decoupling and low frequency decoupling of signals output from the radio frequency power transistor, wherein the one and only one de-coupling capacitance is in the microfarad (µF) range.

7. The semiconductor package device of claim 2, wherein the series resonant inductor and the one and only one decoupling capacitance provide a resonance frequency in a range of 120-150 MHz.

8. The semiconductor package device of claim 7, wherein the resonance frequency provides an instantaneous bandwidth performance of the radio frequency power transistor in the range of 120-150 MHz.

9. The semiconductor package device of claim 6, wherein the radio frequency power transistor is a single ended radio frequency power transistor.

10. The semiconductor package device of claim 2, wherein the radio frequency power transistor is a single ended radio frequency power transistor.

11. The semiconductor package device of claim 3, wherein the radio frequency power transistor is a single ended radio frequency power transistor.

12. The semiconductor package device of claim 4, wherein the radio frequency power transistor is a single ended radio frequency power transistor.

13. The semiconductor package device of claim 7, wherein the radio frequency power transistor is a single ended radio frequency power transistor.

14. The semiconductor package device of claim 8, wherein the radio frequency power transistor is a single ended radio frequency power transistor.

* * * * *